(12) United States Patent
Tsironis

(10) Patent No.: US 11,519,994 B1
(45) Date of Patent: Dec. 6, 2022

(54) CALIBRATION METHOD FOR SLIDE SCREW IMPEDANCE TUNERS

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 17/351,407

(22) Filed: Jun. 18, 2021

(51) Int. Cl.
    *G01R 35/00*    (2006.01)
    *G01R 27/26*    (2006.01)
    *H01P 1/00*     (2006.01)

(52) U.S. Cl.
    CPC ........... *G01R 35/005* (2013.01); *G01R 27/26* (2013.01); *H01P 1/00* (2013.01)

(58) Field of Classification Search
    CPC ...... G01R 35/005; G01R 35/00; G01R 27/26; H01P 1/00; H03J 3/00; H03J 2200/07; H03J 220/08; H03J 220/09
    See application file for complete search history.

(56) References Cited

U.S. PATENT DOCUMENTS

| | | | | |
|---|---|---|---|---|
| 9,257,963 | B1 * | 2/2016 | Tsironis | .................... H01P 5/04 |
| 9,625,556 | B1 * | 4/2017 | Tsironis | ................. G01R 27/32 |
| 10,451,702 | B1 * | 10/2019 | Tsironis | .............. F02D 13/0226 |
| 10,700,402 | B1 | 6/2020 | Tsironis | |
| 10,884,046 | B1 * | 1/2021 | Tsironis | .................... H01P 5/04 |
| 10,938,490 | B1 * | 3/2021 | Tsironis | ............... G01R 35/005 |
| 11,158,921 | B1 * | 10/2021 | Tsironis | ..................... H01P 1/00 |

OTHER PUBLICATIONS

"Load Pull Measurements" [online], Wikipedia [retrieved on Nov. 18, 2016], Retrieved from Internet <URL:http://en.wikipedia.org/wiki/Load_pull>.
"Computer Controlled Microwave Tuner—CCMT", Product Note 41, Focus Microwaves, Jan. 1998.
"Computer Controller Microwave Tuner, CCMT-5010 (1-50GHz)", Datasheet, Focus Microwaves Inc.
Application Note 15, "High resolution Tuners eliminate Load Pull performance errors", Focus Microwaves, Jan. 1995, pp. 6 and 7.

* cited by examiner

*Primary Examiner* — Tarun Sinha
*Assistant Examiner* — James I Burris

(57) ABSTRACT

A new method for calibrating slide screw tuners, both using hexahedron vertically moving and disc-shaped eccentrically rotating reflective tuning probes, allows straightening the reflection factor phase response (anti-skewing); it uses a new scaling method and a new coordinate system of tuning probe control. The method is agnostic and self-regulating, it treats the tuner as a black box and depends on the test frequency. The result is improved mathematical interpolation and tuning results using reduced number of calibration points and allowing higher calibration speed.

2 Claims, 11 Drawing Sheets

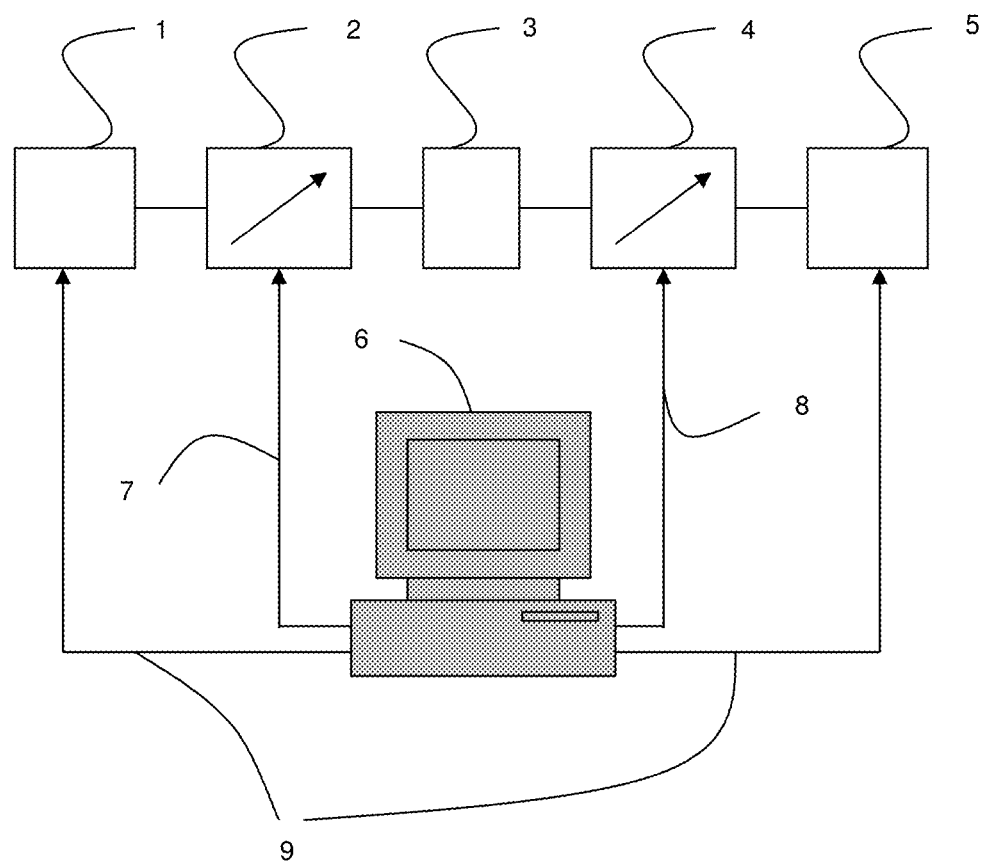
FIG. 1: Prior art

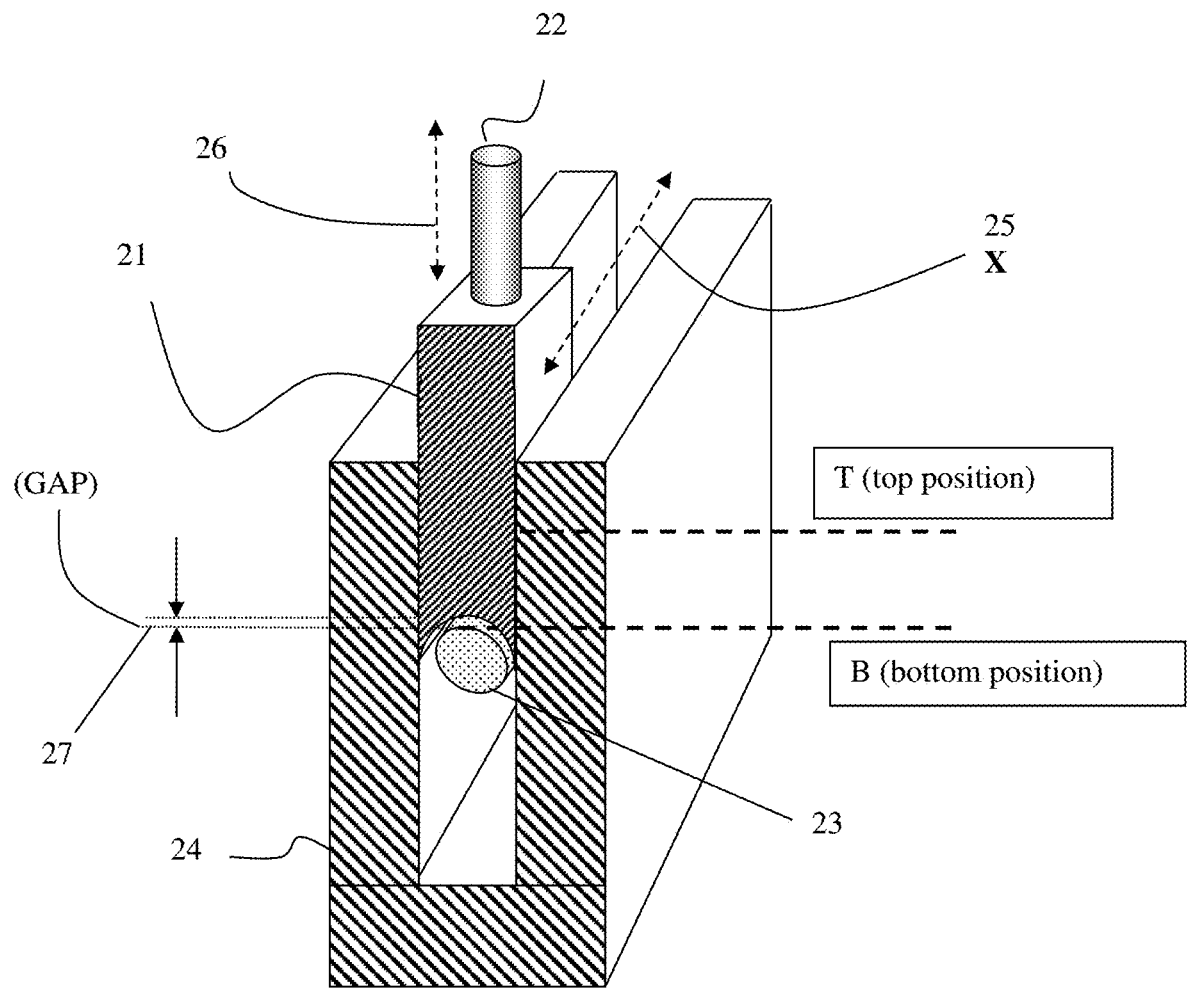
FIG.2: Prior art

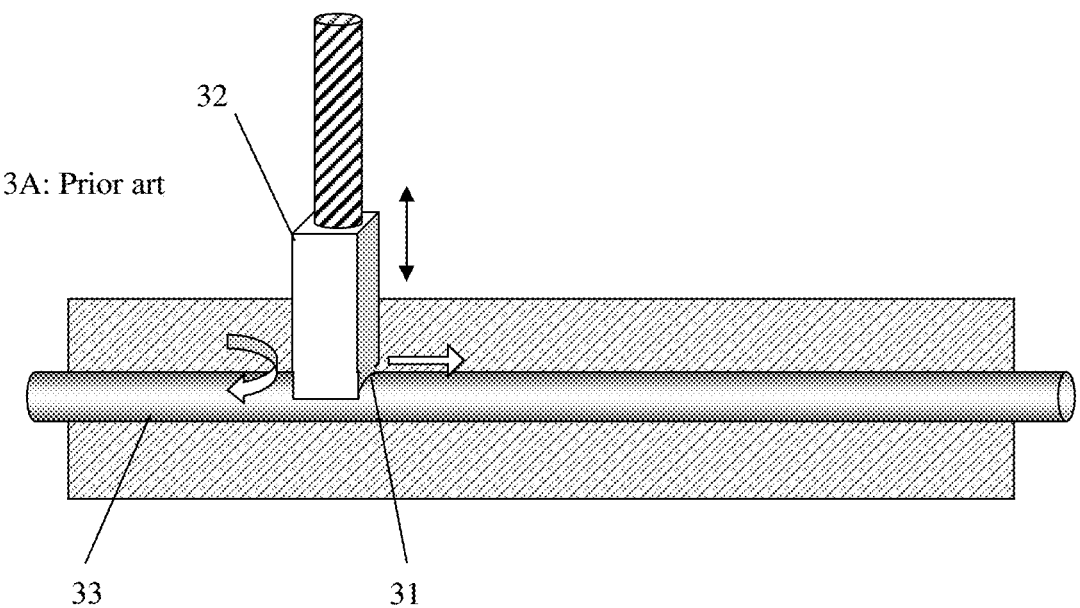
FIG. 3A: Prior art
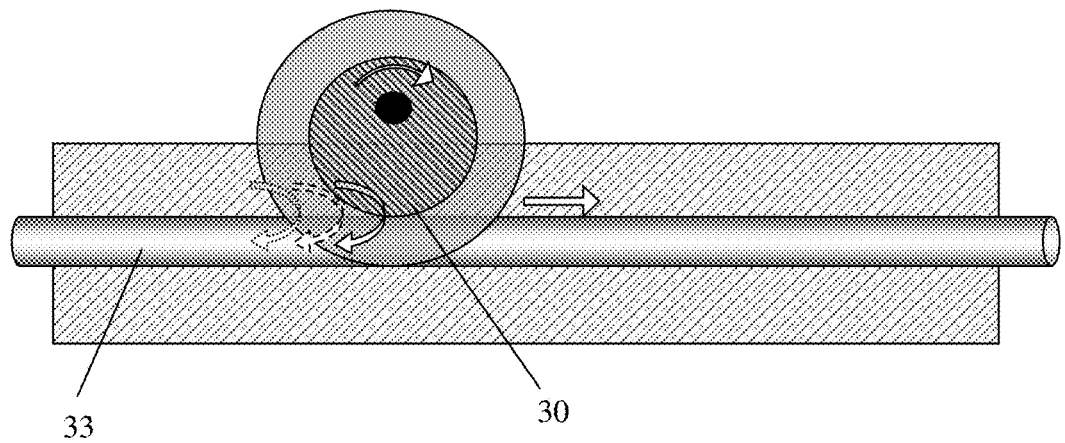
FIG. 3B: Prior art

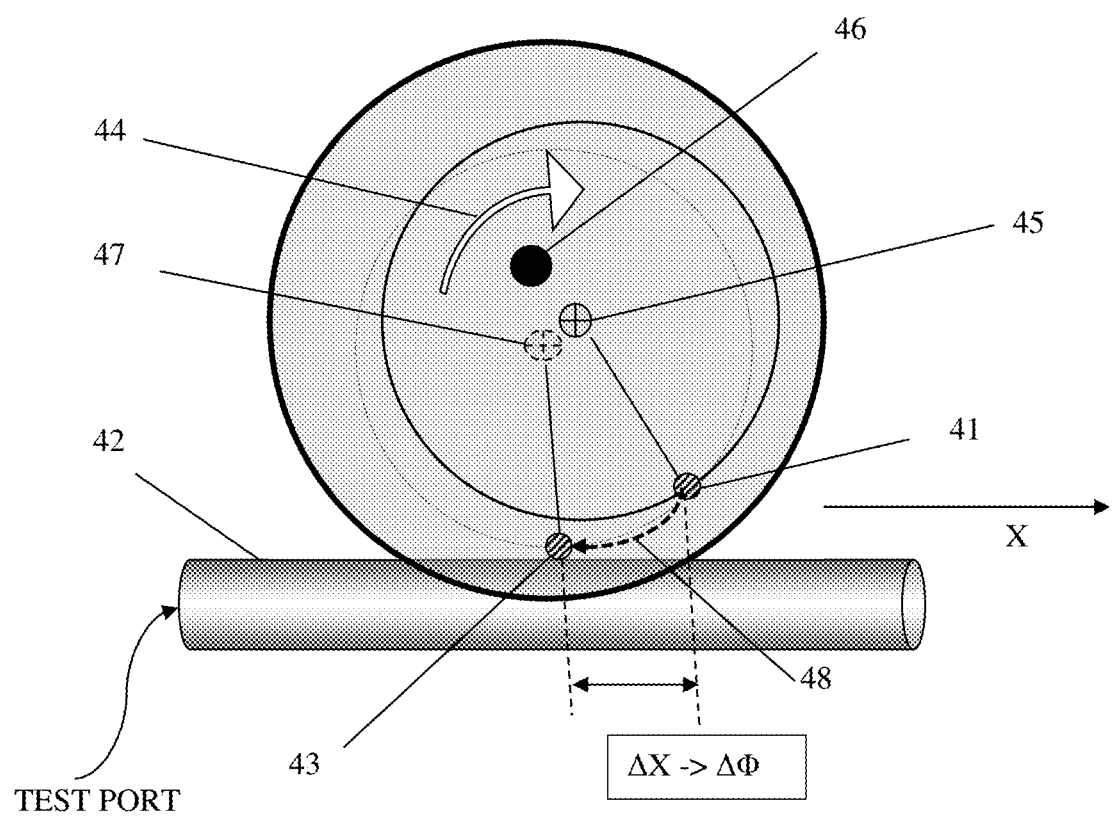
FIG. 4: Prior art

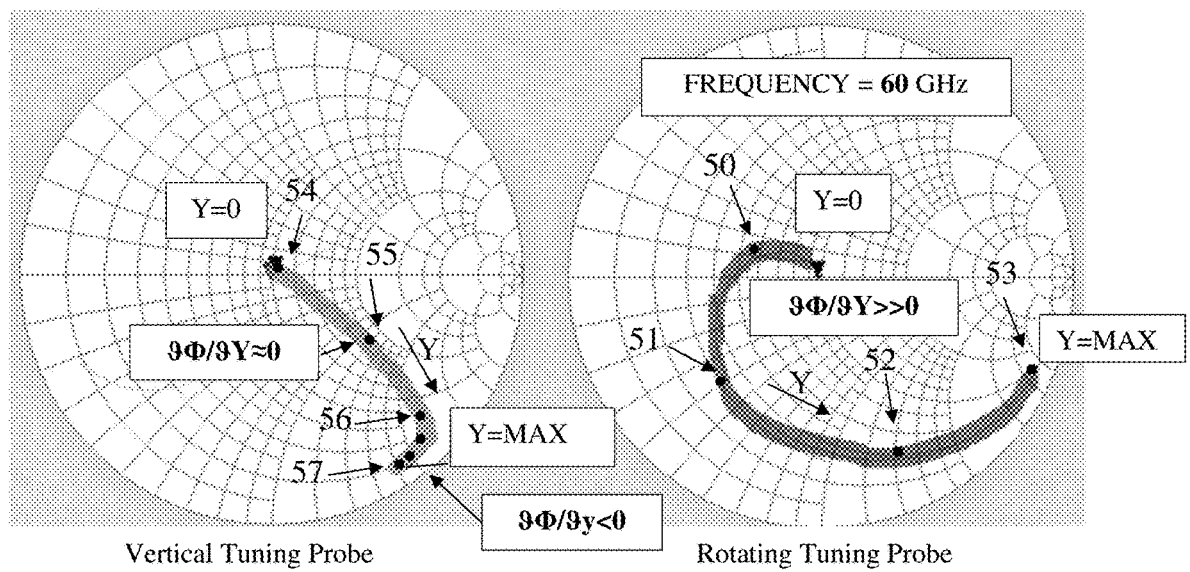
FIG. 5A: Prior art
FIG. 5B: Prior art

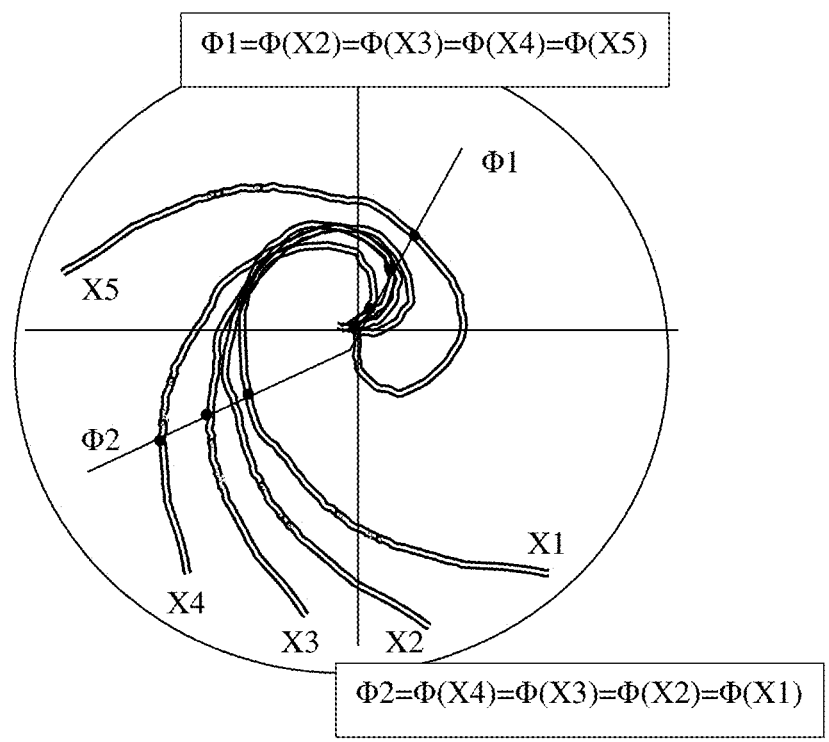
FIG. 6: Prior art

FIG. 8: Prior art

CALIBRATION METHOD FOR SLIDE SCREW IMPEDANCE TUNERS

PRIORITY CLAIM

Not Applicable

CROSS-REFERENCE TO RELATED ARTICLES

1. "Load Pull Measurements" [online], Wikipedia [Retrieved on Nov. 18, 2016] Retrieved from Internet <URL: http://en.wikipedia.org/wiki/Load_pull>
2. "Computer Controlled Microwave Tuner—CCMT", Product Note 41, Focus Microwaves January 1998.
3. "Computer Controller Microwave Tuner, CCMT-5010 (1-50 GHz)", Datasheet, Focus Microwaves Inc.
4. Tsironis C., U.S. Pat. No. 9,257,963, "Impedance Tuners with Rotating Probes".
5. Tsironis C., U.S. Pat. No. 9,625,556, "Method for Calibration and Tuning with Impedance Tuners".
6. Tsironis C., U.S. Pat. No. 10,700,402, "Compact millimeter-wave tuner".
7. Application Note 15, "High resolution Tuners eliminate Load Pull performance errors", Focus Microwaves, January 1995, pages 6 and 7.

BACKGROUND OF THE INVENTION

This invention relates to microwave (W) and millimeter-wave (mmW) frequency testing of RF transistors using various test instruments and remotely controlled electro-mechanical impedance tuners. Modern design of high-power RF amplifiers and mixers, used in various communication systems, requires accurate knowledge of the active device's (microwave transistor's, device under test, DUT) characteristics. In such circuits, it is insufficient for the transistors, which may operate in their highly non-linear regime, close to power saturation, or in very low noise receiver applications, to be described using numeric device models only.

A popular method for testing and characterizing such microwave components (transistors) is "load pull" or "source pull" (see ref. 1). Load/source pull is a measurement technique employing microwave tuners and other microwave test equipment as shown in FIG. 1. The microwave tuners (2, 4) are used in order to manipulate the microwave impedance conditions under which the DUT (3) is tested; the signal is provided by a signal source (1) and the outcoming power is measured by a power meter (5); the whole is controlled by a PC (6), which controls the instruments and the tuners using digital control cables (7, 8 and 9).

DESCRIPTION OF PRIOR ART

The impedance tuners used presently are, typically, "slide screw" (see ref. 2, 3): they use reflective tuning probes inserted into a slotted transmission airline (slabline) to create the required reflections (impedances). The transmission line has a test port facing the DUT and an idle port, connected either with the load or with the source (FIG. 1). Ordinarily the slabline must allow the reflective tuning probe to move freely along its length for at least one half of a wavelength ($\lambda/2$ [mm]≈150/F[GHz]) at the lowest frequency F of operation of the tuner. In the case of the anti-skewing calibration and depending on the tuning probe used (hexahedral or disc) additional space must be allocated for the correcting horizontal probe move. However, this becomes an issue at the lowest frequencies, where the physical length of the slabline is largest. At higher frequencies (and smaller k) the situation is uncritical, because there is normally plenty of space.

Further on we refer only to load tuners, but all definitions and considerations apply symmetrically to source tuners as well. Block-shaped hexahedral reflective tuning probes (slugs) have the typical form shown in FIG. 2. The block (slug) body (21) has a concave semi-cylindrical bottom similar to the shape of the, typically cylindrical, center conductor (23) of the slabline (24) and is attached to a holding rod (22) attached to a precision vertical axis controlled by a vertical stepper motor. The vertical axis moves the tuning probe (slug) (21) towards and away (26) from the center conductor (23) between a Top (withdrawal) and a Bottom (maximum penetration) position. This controls the amount of reflected signal from the signal injected into the slabline and thus the amplitude of the reflection factor, created by the tuning probe. An independent mechanism moves the probe horizontally (X) along (25) the slabline. This controls the phase of the reflection factor relative to a reference test port. The Cartesian movement (X, Y) of the reflective tuning probe corresponds to an equivocal polar trajectory of the complex reflection factor $\Gamma=|\Gamma|*\exp(j\Phi)$ with $|\Gamma|\approx|\Gamma(Y)|$ and $\Phi=\Phi(X)$. Interpolation between calibration points and impedance synthesis (tuning) algorithms have, so far, been based on this specific coordinate system describing to a great extend the hitherto natural tuner behavior.

Eccentrically rotating reflective tuning probes in impedance tuners (see ref. 4) offer an efficient method of reducing the height of a standard tuner body (FIG. 3A) towards a low-profile (FIG. 3B and ref. 6), unit allowing easier integration into the cramped area (FIGS. 8 and 9 in ref. 6) of a wafer probe station. Whereas a traditional vertical axis requires a minimum height (see FIG. 2 in ref. 4) to provide guidance, precision and stability of the vertically moving tuning probe (32), the corresponding mechanism using a rotating reflective tuning probe allows for a height reduction (increase in flatness) of typically a factor of 2. The reflection is created essentially at the closest point between the rotating tuning probe (30) in FIG. 3B, or the non-rotating tuning probe (31) in FIG. 3A, and the center conductor (33).

However (FIG. 4), as the disc-shaped reflective tuning probe rotates (44) around the eccentric rotation axis (46), the center of the disc (45) moves to position (47) and the reflecting area (41) moves on a curved trajectory (48) towards position (43) closer to the center conductor (42) and to the test port. This means that, even though the axis (46) does not move horizontally (X), the reflecting area of the rotating tuning probe does. At high frequencies (>20 GHz) the horizontal shift $\Delta X$ leads to a considerable phase change $|\Delta\Phi|=4\pi*|\Delta X|/\lambda$ relative to the test port (FIG. 5B). At low frequencies this phase change is imperceptible, since $|\Delta X|<<\lambda$ leading to an approximately linear trajectory (54, 55, 56), similar to hexahedral (32) tuning probes (FIG. 3A), shown as part of the trajectory in FIG. 5A. But as the frequency increases, the few millimeters of $\Delta X$ come closer to the wavelength k and affect the behavior of the reflection factor trajectory creating "mechanically caused phase skewing" (FIG. 5B, items 50, 51, 52, 53).

A similar distortion (skewing) of the reflection factor trajectory occurs when the hexahedral-shaped reflective tuning probe (FIG. 2) moves very close to the center conductor, in order to create high reflection factor $\Gamma$ (FIG. 5A), because the capacitance between tuning probe and center conductor increases hyperbolically with the diminishing gap (27), (FIG. 2). We therefore face two opposite behaviors (FIGS. 5A and 5B). In the case of the block (cubical-shaped) tuning probe the phase turns negative (FIG. 5A), because of the strong capacitive effect of the approaching probe; in the case of the rotating reflective tuning probe we face a positive phase turn (FIG. 5B), because of the high reflection area (41) moving, as the disc-probe rotates, towards the test port.

"Tuning" in the context of this invention is the process of synthesizing physically a given reflection factor, or impedance at the test port of the tuner and by extension at the DUT terminals. The relation between the reflection factor r and the impedance Z is: Z=Zo*(1+Γ)/(1−Γ). Γ=0 is at the center of the Smith chart and corresponds, by convention, to Z=Zo=50 Ω; Γ=1 is at the right edge and corresponds to Z=∞, and Γ=−1 is at the left edge and corresponds to Z=0. Zo is the characteristic impedance of the system, typically 50Ω. To synthesize any impedance the tuner not only must have a very high positioning resolution for the tuning probe(s), which, when using appropriate gear reduction, is easily feasible, but also, a previous calibration must either contain a huge number of calibrated points, or the control software be able to interpolate accurately between calibration points. Tuner models, despite linear and well behaving, have been tried in the past and been discarded, because of the best achievable tuning accuracy of ~5%, whereas direct calibration of the tuner and interpolation (see ref. 5) yields tuning accuracy between at least 0.03 (~70 dB) and 1% (~40 dB).

The prior art system software (see ref. 5) accomplishes this interpolation task using nonlinear numerical interpolation and extrapolation routines selected to generate maximum accuracy in shortest computing time. The mechanics of the tuner control the reflective tuning probe in X and Y direction. This, for low to medium reflection factor leads to corresponding amplitude and phase control of the reflection factor Γ=|Γ|*exp(jΦ) with independent dependence: |Γ|=f(Y) and Φ=f(X). This can be seen in FIGS. 8 and 9. Rotating reflective tuning probes (FIG. 5B) create important skewing from the start of the vertical movement, whereas hexahedral probes only above |Γ|≈0.85 (FIG. 5A); Block probes maintain their behavior across frequencies, whereas rotating reflective disc tuning probes create increasing skewing with frequency. It seems therefore impossible to create a theory and a formula to capture both opposing phenomena. The second order Lagrange interpolation algorithm used so far fails when skewing is too strong (see ref. 7).

In the case of rotating reflective tuning probes (FIGS. 3B and 5B) the interpolation algorithm does not work above a certain frequency of operation F, also because the ambiguous Cartesian relation between amplitude and phase of the reflection factor, caused by the horizontal (phase) and vertical (amplitude) movement of the reflective tuning probe, is lost (FIG. 6). For the prior art interpolation theory between calibration points to work accurately it must be: ∂|Φ|/∂Y≈0 and ∂|Γ|/∂X≈0 which is approximately valid for a vertically moving tuning probe up to a certain r (item (56) in FIG. 5A), invalid above (57) and also clearly invalid for a rotating probe (FIGS. 5B and 6). As FIG. 6 also shows, the additional handicap facing interpolation and tuning (impedance synthesis) algorithms of rotating probes is the multitude of horizontal positions Xi yielding the same phase Φ1, Φ2 . . . other than in a Cartesian grid, where each pair {Xi, Yj} of horizontal and vertical positions of the tuning probe yields a single and unique reflection factor $\Gamma_k = |\Gamma_k|*\exp(j\Phi_k)$; see FIG. 6, where on each circle Y=const. for each horizontal X position, there is always a unique phase Φ.

BRIEF DESCRIPTION OF THE INVENTION

The invention introduces a new coordinate system for the control and positioning of the tuning probe, applicable to both regular hexahedron-shaped vertical tuning probes (FIG. 3A) and rotating disc probes (FIG. 3B). Instead of simple horizontal (X) and vertical (Y) probe control {X,Y} for hexahedron-shaped probes and horizontal (X) and angle (Φ) control {X,Φ} of rotating probes, the new coordinate system introduces a new axis Z as follows: Hexahedron-shaped probes: {Z, Y}, rotating probes: {Z, D}; the new variable Z is a function of X, Y and (and is determined ahead of tuner calibration. It is obvious that the new coordinate Z, which depends on Y and Φ, replaces X in both cases, or, as the probe approaches the center conductor, the horizontal position of the probe changes (FIG. 9, point (Z2,Y4)). A simple and generic solution is to determine the dependence of Z of Y and (once before starting the actual tuner calibration data collection and keep it throughout the calibration and interpolation procedures. The determination executes during "scaling" (see ref. 5, column 5, lines 1-15) but modifying X such that the phase of the reflection factor remains constant during probe insertion into the slabline. This corrects for the skewing phase rotation. To solve this problem a new coordinate system is required ensuring probe movement for accurate interpolation and tuning. After correction the trajectories are straightened; the probe moves to Z1 instead of X1 and to Z2 instead of X2 (FIG. 7). More complex mechanisms are imaginable but do not affect the concept of combining the phase controlling horizontal movement with the amplitude controlling vertical movement to keep the phase of the probe response constant.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated transistor load pull test system.

FIG. 2 depicts prior art, a perspective view and relevant dimensions and parameters of the operation of a vertically operating hexahedron-shaped RF tuning probe (slug).

FIG. 3A through 3B depict prior art, two tuning probe control concepts: FIG. 3A depicts the traditional vertical tuning probe; FIG. 3B depicts the rotating tuning disc-formed probe concept.

FIG. 4 depicts prior art, the detailed operation and relevant items of a rotating disc-formed tuning probe.

FIG. 5A through 5B depict prior art, FIG. 5A depicts the reflection factor response of a vertically moving probe and FIG. 5B depicts the reflection factor response of a rotating probe at higher frequencies (typically above 20 GHz).

FIG. 6 depicts prior art, reflection factor trajectories of rotating tuning probes for various horizontal tuning probe positions.

DETAILED DESCRIPTION OF THE INVENTION

Figure 9:
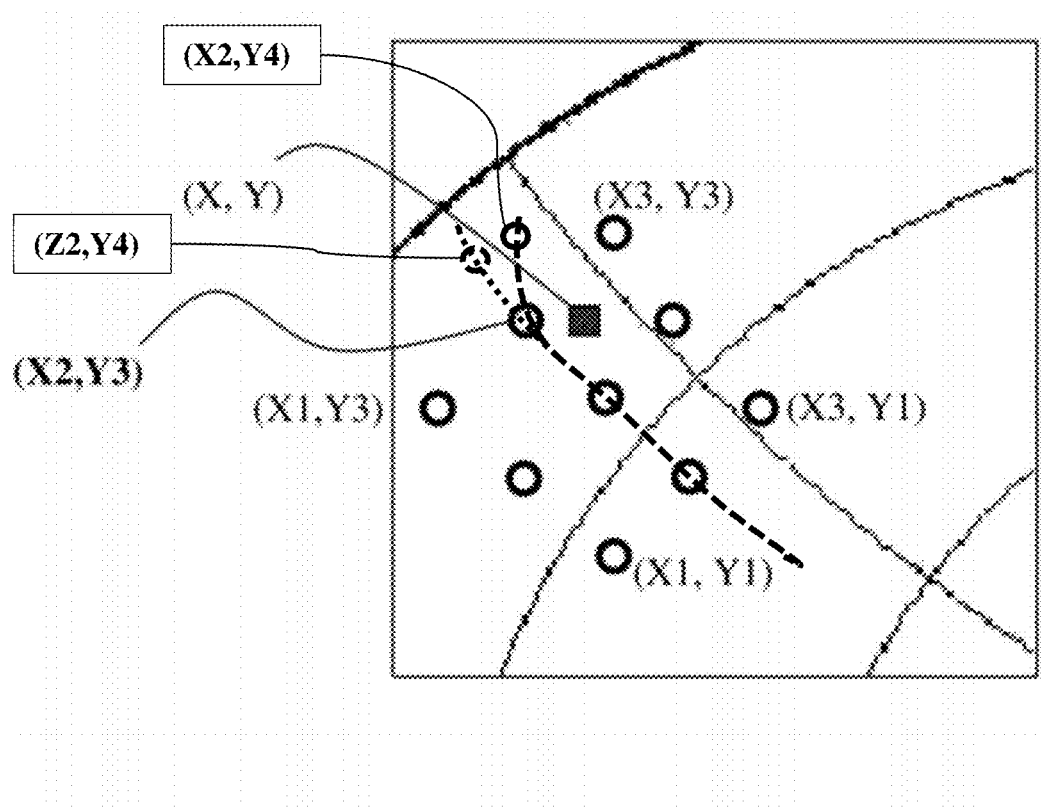
FIG. 9 depicts skewing mechanism and compensation by the calibration method.

This invention discloses a calibration method for vertically moving hexahedron-shaped and rotating disc-probes of slide screw impedance tuners. The method is agnostic. It adapts automatically to the type of tuner and the calibration frequency. It uses a new probe control coordinate system, which replaces the traditional Cartesian X,Y control system for hexahedron-shaped probes and the linear-angular X,ψ system for disc-shaped rotating probes. Interpolation and tuning algorithms of the tuner managing software remain the same, albeit using the new coordinate system. The trace un-skewing obtained using the method increases the accuracy of interpolation and tuning and reduces the requirement for high density calibration points close to |Γ|=1, otherwise required to piecewise linearize the calibration trajectories (FIG. 9).

The proposed mechanism for compensating the phase skewing at any fixed frequency F, created by either the rotating disc tuning probes as shown in FIG. 5B, items (50) to (53), or at high proximity of the hexahedron-shaped probe to the center conductor, FIG. 5A, items (56) to (57), includes a different "scaling" procedure from the one described in ref. 5, column 5, lines 1-15. This includes the following steps (FIG. 10): in a first step (100) the tuner is connected to a pre-calibrated vector network analyzer (VNA), the calibration parameters and allowable phase drift are defined (101); then the RF probe is withdrawn and initialized horizontally (102) at sufficient electrical distance X0 from the test port, which depends on the test frequency F; this electrical distance (read physical distance, since the slabline is an airline, thus ($\lambda_o=\lambda(\varepsilon_r=1)$)), X0 is determined by running a few trials and varies with frequency, but it is constant along the slabline; the only critical action here is to place the tuning probe far enough from the test port along the slabline, so as not to hit any mechanical limit switch when determining a reverse move, when compensating for the skewing: we therefore have an additional parameter to the prior art calibration to consider, the minimum distance from a physical limit switch closest to the test port, called X0=X0(F). Then the tuning probe is remotely inserted (or rotated-in) gradually into the slot of the slabline of the tuner (107) while the reflection factor S11=|S11|*exp(jΦ11) is measured on the VNA at the tuner's test port inside the loop (106), to reach the next reflection factor level N/NC, wherein N=1, 2, 3 . . . NC, where NC is the user-defined number of concentric circles of the calibration (FIG. 8); tolerance criteria for the change in Φ11 are entered as ΔΦ (101) and verified during the insertion process. If Φ11 deviates (drifts away) from the target value, the probe is moved horizontally by ΔX, (104), while measuring S11, to compensate for this drift. Once the phase Φ11 is within the tolerances Φ11±ΔΦ/2 the position {Z=X+ΔX,Y} or {Z=X+ΔX,Φ} of the RF tuning probe is saved for reflection factors at predetermined levels (103) in several (typically NC=10 to NC=20) equal steps between 0, when the probe is withdrawn, and maximum reflection close to 1 on a Smith chart, when the probe is at its maximum penetration; the saved vertical positions thus correspond to |S11| values of 0.1, 0.2, 0.3 . . . 0.9, or 0.05, 0.1, 0.15 . . . 0.95 etc. (loop (103)) The marked positions and associated |S11| values are saved in a data array in memory to be used immediately after; this first anti-skewing step procedure is called "vertical scaling".

Figure 7:
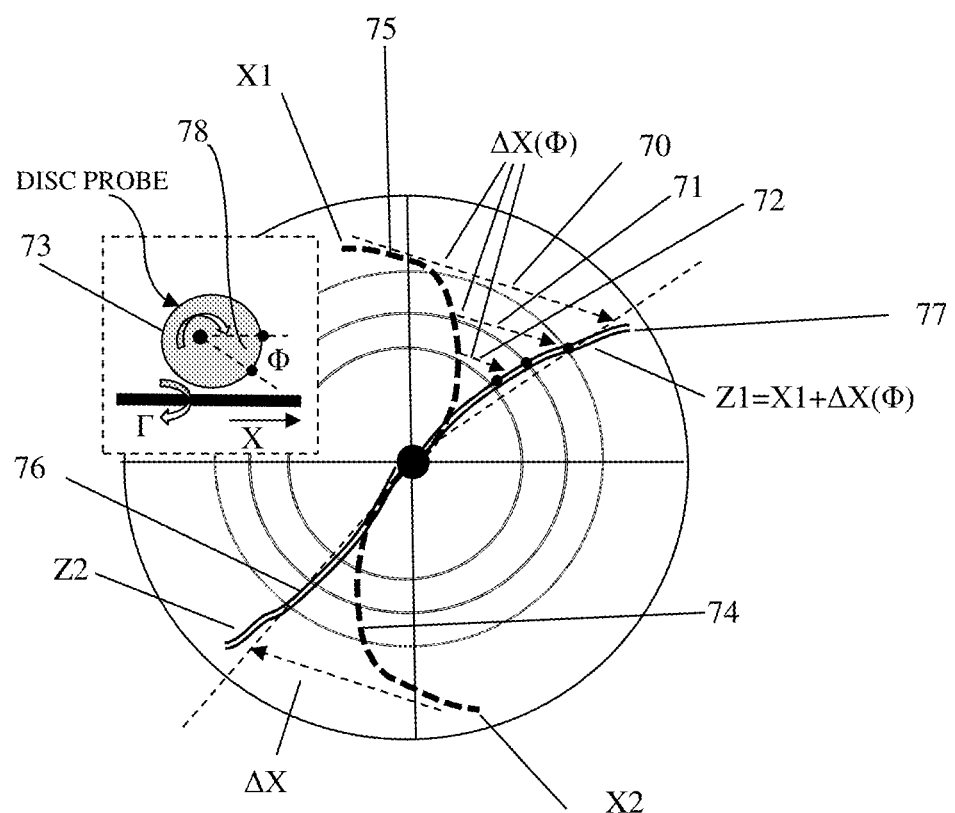
FIG. 7 depicts original and corrected reflection factor trajectories of rotating disc tuning probes for two horizontal tuning probe positions. The insert depicts the definition of X, ΔX and Φ.
Figure 10:
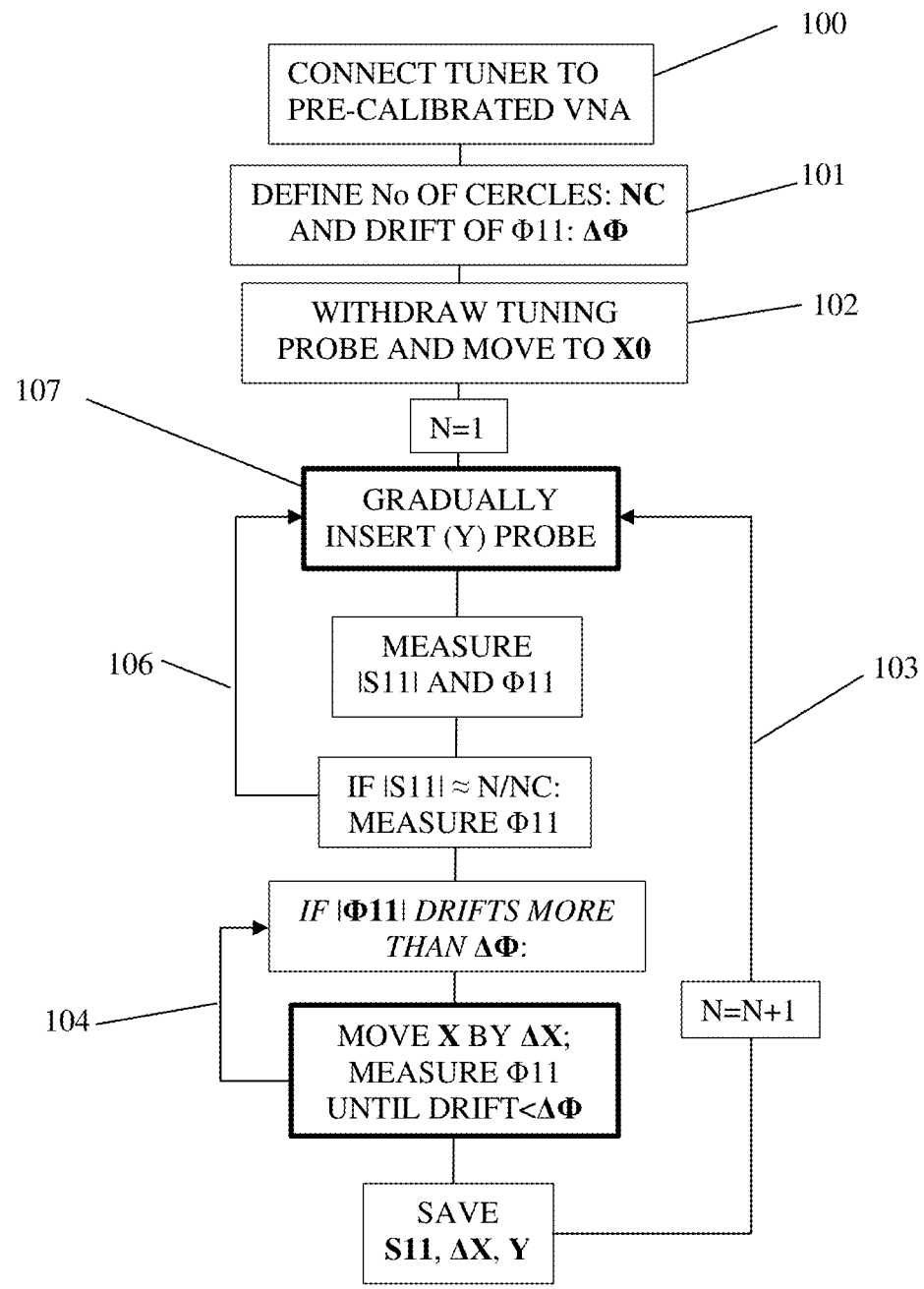
FIG. 10 depicts flowchart of anti-skewing scaling procedure.

The anti-skewing scaling correction mechanism becomes clear in the case of an eccentrically rotating reflective disc-probe (73) viewing FIG. 7: uncorrected vertical scaling trajectories (74) and (75) are straightened into trajectories (76) and (77) through horizontal ΔX(Φ) displacement of the tuning probe, the size of which depends on the angle ((or the probe penetration (78)) as shown by the arrows (70), (71), (72). This ΔX(( ) or ΔX(Y) is determined by the new scaling procedure (FIG. 10).

Figure 11:
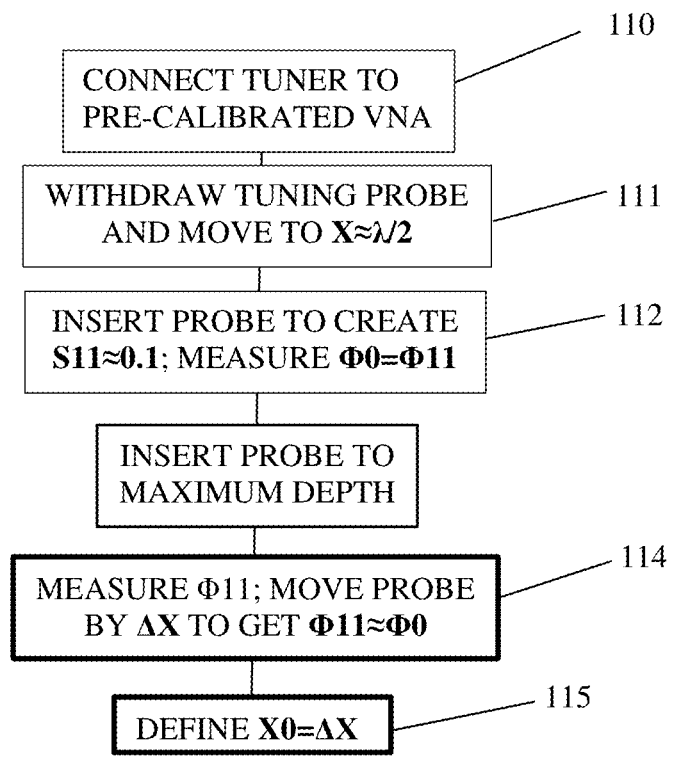
FIG. 11 depicts flowchart of maximum anti-skewing horizontal correction.

The distance X0 is determined as follows (FIG. 11): after the tuner has been connected to a pre-calibrated VNA (110) then: first the tuning probe is withdrawn and moved approximately λ/2 along the slabline (111); there the probe is inserted slightly into the slot of the slabline, until the reflection factor S11 at the test port reaches approximately 0.1, at which time we measure the phase Φ11 and set Φ0=Φ11 (112). Then we push the tuning probe further into the slot of the slabline until maximum depth, close before galvanic contact with the center conductor; the phase Φ11 changes, we measure it and move the probe horizontally by a distance ΔX such that Φ11 becomes again equal Φ0 (114). This is then X0: X0=ΔX (115). The valid assumption here is that maximum skewing occurs at maximum probe penetration. From now on the starting point of horizontal travel is X0: Z0=X0; Z(X,Y)=X0+X+ΔX(Y). The actual distance ΔX recovering the phase skewing depends on the penetration Y but cannot exceed X0 at any specific frequency.

In a second step of the calibration, the saved positions {Z=X0+X+ΔX,Y} or {Z=X0+X+ΔX,Φ} of the reflective tuning probe are used to position the probe at various horizontal distance from the test port and depths inside the slabline; the probe is moved in equal steps along the slabline over a total length of half a wavelength at the test frequency F, in order to create concentric reflection factor circles on the Smith chart and cover 3600 of reflection factor angle (FIG. 8); the movement steps of the RF probe are chosen such as to generate a sufficient amount of approximately equidistantly space-distributed (spread) reflection factors on the Smith chart; a simple method to do so is to increase the number of points (NP) on each concentric circle as the radius of the reflection factor increases following a simple rule, such as NP=N0*|S11|, where NO increases from 80 to 160 as the Radius |S11| increases from 0.1 to ≈1.0; this means for |S11|=0.1 NP varies between 8 and 16 and for |S11|≈1, NP varies between 80 and 160. This translates to angular distance between 360/8=45° or 360/16=22.5° at |S11|~0.1 and 360/80=4.5° or 360/160=2.25° at |S11|≈1.

Figure 8:
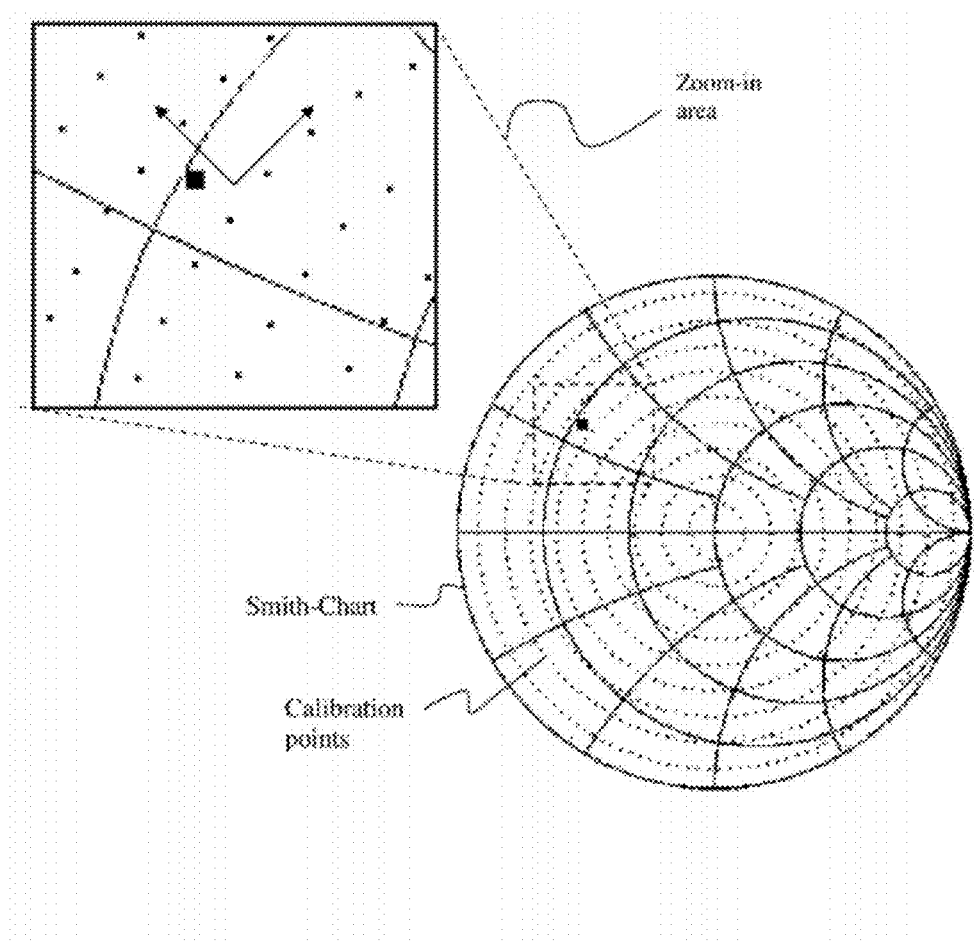
FIG. 8 depicts prior art, calibration points of slide screw tuner using hexahedron-shaped probe.

For each re-positioning of the RF tuning probe full two-port s-parameters of the tuner are measured on the network analyzer and saved in a tuner calibration file for the test frequency F in the format {Z,Y, Sij} or {Z,Φ,Sij} for {i,j}={1,2}; since all remote control is through stepper motors, all dimensions are expressed and all calculations are executed in motor steps and neither in mm or degrees. The translation control gears used, define each time the actual physical position of the tuning probe, but for the entire operation it is irrelevant. If, for instance 1.8° stepper motors are used and 2:1 reducing gear, then 200 motor steps cause 180° rotation or 0.9° per motor step. In X and Y direction a motor step can be converted from 1.5 μm to 25 μm typically, by selecting the parameters of the control gear (lead screw pitch and pulley diameter) to match for any frequency and wavelength. This procedure yields a distribution of calibrated points (S11) on the Smith chart, at any frequency as shown in FIG. 8; upon retrieval of the s-parameters from the calibration file an interpolation algorithm is required to allow computing s-parameters of the tuner two-port at any of possible RF probe's positions not included in the grid of already measured and saved calibration points in the calibration data file (see ref. 5, column 5, lines 62-67 and column 6, lines 1-13).

Slide screw tuners, using both hexahedron and disc-shaped reflective tuning probes, maintain the vertical scaling behavior across the total horizontal travel. It is therefore not necessary to repeat the scaling routine more than once per frequency. As can be seen in FIG. 9, the final point (X2, Y4) closest to the edge of the Smith chart, is corrected back to the point (Z2, Y4), which is on the same quasi-straight line as all the previous X=X2=constant positions. In this well behaving case, therefore, we would get Z(Y<Y4)≈X and Z(Y4)=X−|ΔX| (the tuning probe is moved towards the test port). There is no obvious mathematical relation describing commonly this behavior; it is therefore preferable to generate the scaling table [S11, ΔX, Y] simply using the algorithm shown in FIG. 10, which uses the phase of S11, i.e. Φ11, as a regulation criterion.

The concept of using a new coordinate system for calibrating slide screw impedance tuners for better interpolation and tuning accuracy has been presented. The method is agnostic both regarding tuner type and frequency. Obvious alternatives, in particular attempts to replace direct scaling with numerical approximations, are imaginable but shall not impede on to the general validity of the present invention.

What is claimed is:

1. An anti-skewing calibration method for slide screw impedance tuners at a frequency F comprising: a scaling step and a calibration step,
wherein,
the slide screw impedance tuners comprise:
a slabline having a test port and an idle port, and
at least one reflective tuning probe, remotely movable along and insertable into the slabline between a state of withdrawal and a state of maximum penetration,
and wherein
the scaling step comprises:
a) connect the tuner to a pre-calibrated vector network analyzer,
b) withdraw the reflective tuning probe and place it at a frequency dependent distance X0 from the test port, along the slabline,
c) gradually inserting the reflective tuning probe to a multitude of penetration positions Y and measuring a reflection factor amplitude S11(Y) and phase Φ11(Y) at the tuner test port,
d) correcting the position of the reflective tuning probe along the slabline by ΔX(Y) to keep a change of Φ11 within a tolerance,
e) saving scaling data S11(Y), ΔX(Y), Y;
and wherein
the calibration step comprises:
f) retrieving scaling data from step e),
g) placing the reflective tuning probe at penetration positions Y and at a multitude of positions along the slabline Z=X0+X+ΔX(Y) for 0≤X≤λ/2,
h) measure s-parameters Sij(Z,Y) for {i,j}={1,2} of the tuner and save.

2. The anti-skewing calibration method for slide screw impedance tuners of claim 1, wherein
the frequency dependent distance X0 from the test port is determined as follows:
a) connect the tuner to a pre-calibrated vector network analyzer,
b) withdraw the reflective tuning probe and place at a distance at least X≈λ/2 at the frequency F from the test port, along the slabline,
c) insert the reflective tuning probe to create reflection factor S11≈0.1,
d) measure the phase Φ0=Φ11 of the reflection factor at the frequency F,
e) insert the reflective tuning probe to maximum penetration,
f) measure the phase Φ1=Φ11 of the reflection factor at the frequency F,
g) move the reflective tuning probe by ΔX along the slabline to obtain Φ1≈Φ0,
h) save X0=ΔX.

* * * * *